United States Patent
Mendelson et al.

[11] Patent Number: 5,888,838
[45] Date of Patent: Mar. 30, 1999

[54] METHOD AND APPARATUS FOR PREVENTING CHIP BREAKAGE DURING SEMICONDUCTOR MANUFACTURING USING WAFER GRINDING STRIATION INFORMATION

[75] Inventors: Ronald Lee Mendelson, Richmond, Vt.; Robert Francis Cook, Putnam Valley, N.Y.; David Frederick Diefenderfer, Manassas, Va.; Eric Gerhard Liniger, Danbury, Conn.; John M. Blondin, Colchester; Donald W. Brouillette, St. Albans, both of Vt.

[73] Assignee: International Business Machines Corporation, Armonk, N.Y.

[21] Appl. No.: 90,563

[22] Filed: Jun. 4, 1998

[51] Int. Cl.$^6$ .................................................. G01N 31/26
[52] U.S. Cl. ........................... 438/15; 438/15; 438/462; 438/973; 148/DIG. 162
[58] Field of Search ................................ 438/14, 15, 462, 438/973; 148/DIG. 162

[56] References Cited

U.S. PATENT DOCUMENTS

| | | |
|---|---|---|
| 4,333,983 | 6/1982 | Allen ........................................ 428/336 |
| 4,663,890 | 5/1987 | Brandt . |
| 4,968,628 | 11/1990 | Delgado et al. . |
| 5,162,241 | 11/1992 | Mori et al. . |
| 5,506,672 | 4/1996 | Moslehi .............................. 356/359 |
| 5,546,797 | 8/1996 | Dutta et al. ......................... 73/150 A |

OTHER PUBLICATIONS

Tummala et al., Microelectronics Packaging Handbook--Semiconductor Packing--Part II, Second Edition,, pp. 513–515 , 1997.

*Primary Examiner*—Richard A. Booth
*Assistant Examiner*—John Murphy
*Attorney, Agent, or Firm*—Whitham, Curtis & Whitham; James Leas

[57] ABSTRACT

A method is described by which the mechanical strength of chips of semiconductor devices can be controlled by appropriate wafer finishing and sorted by knowledge of the finishing method and chip and wafer geometry. The control and sorting derive from a knowledge of the geometry of the striations remaining on the back of chips after the wafer-grinding finishing step.

17 Claims, 10 Drawing Sheets

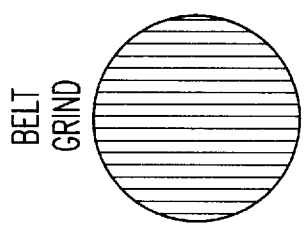
FIG.2A BELT GRIND
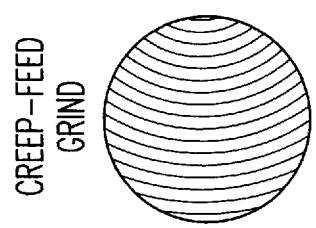
FIG.2B CREEP-FEED GRIND
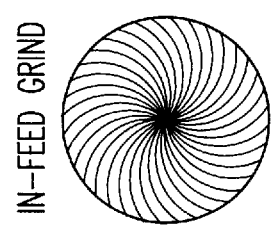
FIG.2C IN-FEED GRIND
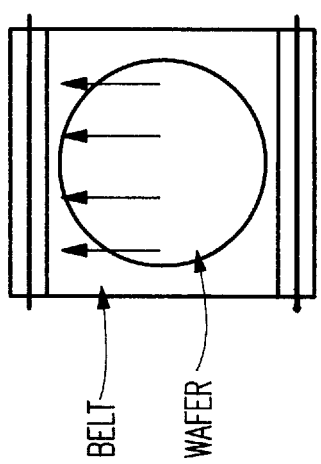
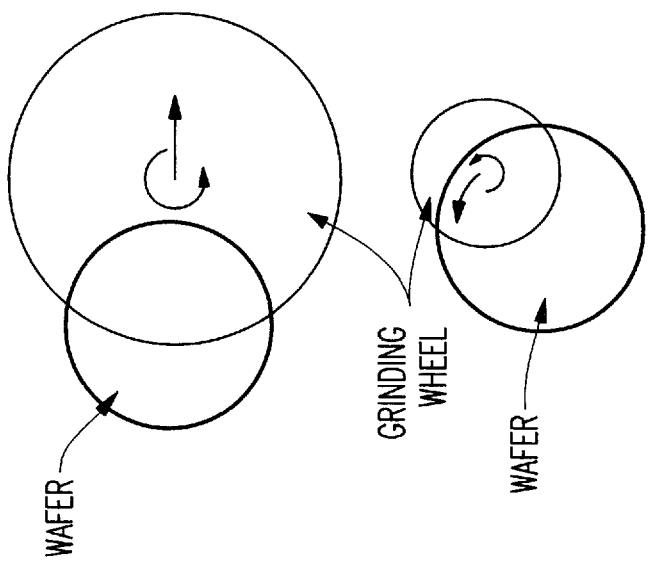

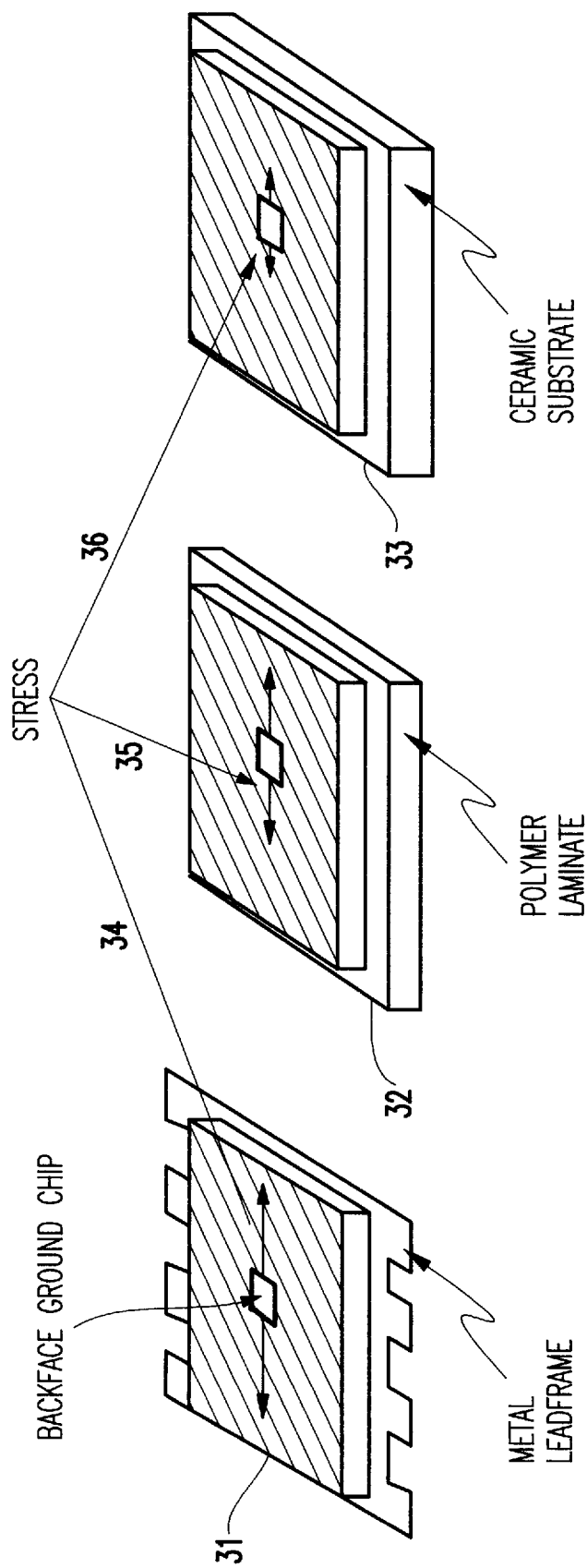

METHOD AND APPARATUS FOR PREVENTING CHIP BREAKAGE DURING SEMICONDUCTOR MANUFACTURING USING WAFER GRINDING STRIATION INFORMATION

BACKGROUND OF THE INVENTION

1. Field of the Invention

The present invention generally relates to semiconductor chip manufacture and more particularly to the prevention of chip breakage during manufacturing process steps.

2. Background Description

The production of an individual semiconductor device involves four stages prior to assembly into an electronic component, as shown in prior art FIG. 1.

The first stage is front end of line (FEOL 11), in which dopants and materials are implanted into, or deposited onto, the semiconducting material—usually silicon—of the substrate wafer and heat treated. The FEOL 11 generates many individual logic gates, memory cells or other discrete circuit elements over the wafer surface.

The next stage is back end of line (BEOL 12), in which successive layers of conductors and insulators are deposited onto the wafer to make a three-dimensional structure interconnecting the individual elements. The BEOL 12 generates very-large-scale integrated (VLSI) circuits patterned in a rectangular array over the wafer as individual devices. After BEOL 12 processing the VLSI devices are probed or tested 13 for speed or quality and a map 14 is generated of the electrical performance of the devices on the wafer.

The third stage, wafer finishing, consists of two sub-stages: back-side grind (BSG 15) and dice, sort and pick (DSP 16). In the BSG 15 operation the wafers are ground on the back (non-device) side using a grinding wheel to generate a wafer of appropriate thickness and back-side surface finish. In the DSP 16 operation the individual devices (dice or chips) are separated via a dicing or sawing operation along the intervening scribe lines and then picked from the structure used to support the wafer during the dicing operation, using 17 the performance map 14 created at the end of the BEOL 12 stage to sort the picked chips for placement in containers suitable for packaging operations.

The fourth and final stage is packaging (PKG 18), in which an individual chip is mounted onto a larger carrier, electrical connections are made between the chip and the electrical circuitry of the carrier, and then the whole finally sealed or encapsulated and tested. The mechanical yield and reliability of a finished device is determined by the mechanical performance of the chip, set during the BSG 15 and DSP 16 stages.

Improper FEOL 11 or BEOL 12 processing or electrical mis-sorting during DSP 16 leads to devices that fail to perform with the appropriate electrical characteristics. Analogously, improper BSG/DSP/PKG processing or mechanical mis-sorting or non-sorting leads to devices that fail mechanically. Many PKG 18 schemes impose significant stresses on the contained die (i.e. the chip which has been diced from a wafer in the manufacturing process), the most damaging being tensile stresses leading to fracture of the brittle semiconducting material. The strength of the chips is critical to acceptable mechanical yield during and after PKG 18, just as appropriate FEOL 11 and BEOL 12 processing is critical to acceptable electrical yield prior to wafer finishing. Obviously, greater strength chips are more resistant to fracture and can therefore lead to smaller yield losses and greater reliability. The strength of a die set by the BSG 15 and DSP 16 operations can be enhanced by attention to these operations, but usually at the expense of increased processing time and increased cost.

Currently, in contrast to the electrical performance, no sorting is done of the mechanical strength of a die to match it to the requirements set by the PKG 18 stress. For example, turning to prior art FIG. 3, mounting of a chip onto a metallic leadframe 31 (FIG. 3A) imposes greater tensile stress 34 on the backface of the chip than the tensile stress 35 from mounting onto a fiberglass-polymer composite laminate 32 (FIG. 3B), which in turn imposes greater stress 36 than does mounting onto a ceramic substrate 33 (FIG. 3C). A lack of mechanical sorting would lead to increasing yield loss at the packaging stage PKG 18, for use of substrates made of ceramic, polymer composite, and metal, respectively. All yield losses could be reduced to a minimum by sorting the highest strength chips into the highest stress packages.

SUMMARY OF THE INVENTION

It is therefore an object of the present invention to sort the highest strength chips into the highest stress packages, thereby avoiding the sorting of low-strength chips into high-stress packages.

It is also an object of the invention to classify chips according to their tensile or bending strength by direct inspection of the orientation of grinding striations on the backside of a chip.

It is a further object of the invention to provide finishing methods that allow all chips on a backside-ground wafer to exceed a given strength level.

Another and related object of the invention is to set the strength level by controlling the wafer and grinding wheel or belt geometries.

An additional object of the invention is to allow backside-ground chips to be classified by strength at the wafer level, without inspection, permitting a map of mechanical peformance to be overlayed on that of electrical performance and therefore allow devices to be picked and sorted for various applications and packaging schemes.

A related object of the invention is to create a mechanical performance map from knowledge of the wafer, chip and grinding wheel geometries.

The invention uses a relation between striation orientation and chip strength and provides a method for classifying chips according to their tensile or bending strength by direct inspection of the orientation of grinding striations on the backside of a chip. It provides finishing methods that allow all chips on a backside-ground wafer to exceed a given strength level. Another aspect of the invention is that the strength level can be set by controlling the wafer and grinding wheel or belt geometries.

The invention provides sorting methods that allow backside-ground chips to be classified by strength at the wafer level, without inspection, permitting a map of mechanical peformance to be overlayed on that of electrical performance and therefore allows devices to be picked and sorted for various applications and packaging schemes. A feature of these methods is that the mechanical performance map can be created from knowledge of the wafer, chip and grinding wheel geometries.

BRIEF DESCRIPTION OF THE DRAWINGS

The foregoing and other objects, aspects and advantages will be better understood from the following detailed description of a preferred embodiment of the invention with reference to the drawings, in which:

FIG. 2A shows a schematic diagram of a prior art belt grinding method, in which a rotating abrasive grinding belt is translated over a semiconductor wafer perpendicular to the wafer and belt axes, leaving parallel, linear grinding striations. FIG. 2B shows a schematic diagram of a prior art creep-feed grinding method, in which the center of a rotating abrasive grinding wheel is translated over the center of the wafer along a line perpendicular to the grinding wheel axis, leaving parallel, circular grinding striations. FIG. 2C shows a schematic diagram of a prior art in-feed grinding method, in which the center of a rotating abrasive grinding wheel is rotated in a circle perpendicular to the grinding wheel axis about the wafer center, leaving intersecting, circular grinding striations.

FIG. 3 shows schematic diagrams of unencapsulated backface-ground chips mounted in packaging schemes that impose various levels of tension on the backface of the chip: FIG. 3A shows a metallic lead frame 31, which leads to maximum tension on the chip; FIG. 3B shows a fiberglass-polymer laminate composite 32, which leads to moderate tension on the chip; FIG. 3C shows a ceramic substrate 33, which leads to minimum tension on the chip. The degree of tension on the backface of the chip is indicated by the size of the arrows 34, 35 and 36.

DETAILED DESCRIPTION OF A PREFERRED EMBODIMENT OF THE INVENTION

Many semiconductor devices—particularly memory chips—are back-face ground as shown in FIG. 2A so as to enable a reduction in the overall thickness of the finished package. Examples include those for small outline J-lead (SOJ) packages and thin small outline packages (TSOP), both of which use the metallic lead frame shown in FIG. 3A as the chip carrier. The devices for such packages are usually rectangular and the packaging process often generates significant tension in the backface of the device along its long axis, as indicated by stress arrow 34 in FIG. 3A. If the tension generated by the package exceeds the fracture strength of the chip, the consequent mechanical failure leads to electrical failure of the device. The focus of the present invention is the prevention of unwanted failures for such chips and packaging schemes, although the principles will also clearly apply to square chips and other stress configurations.

Figure 1:
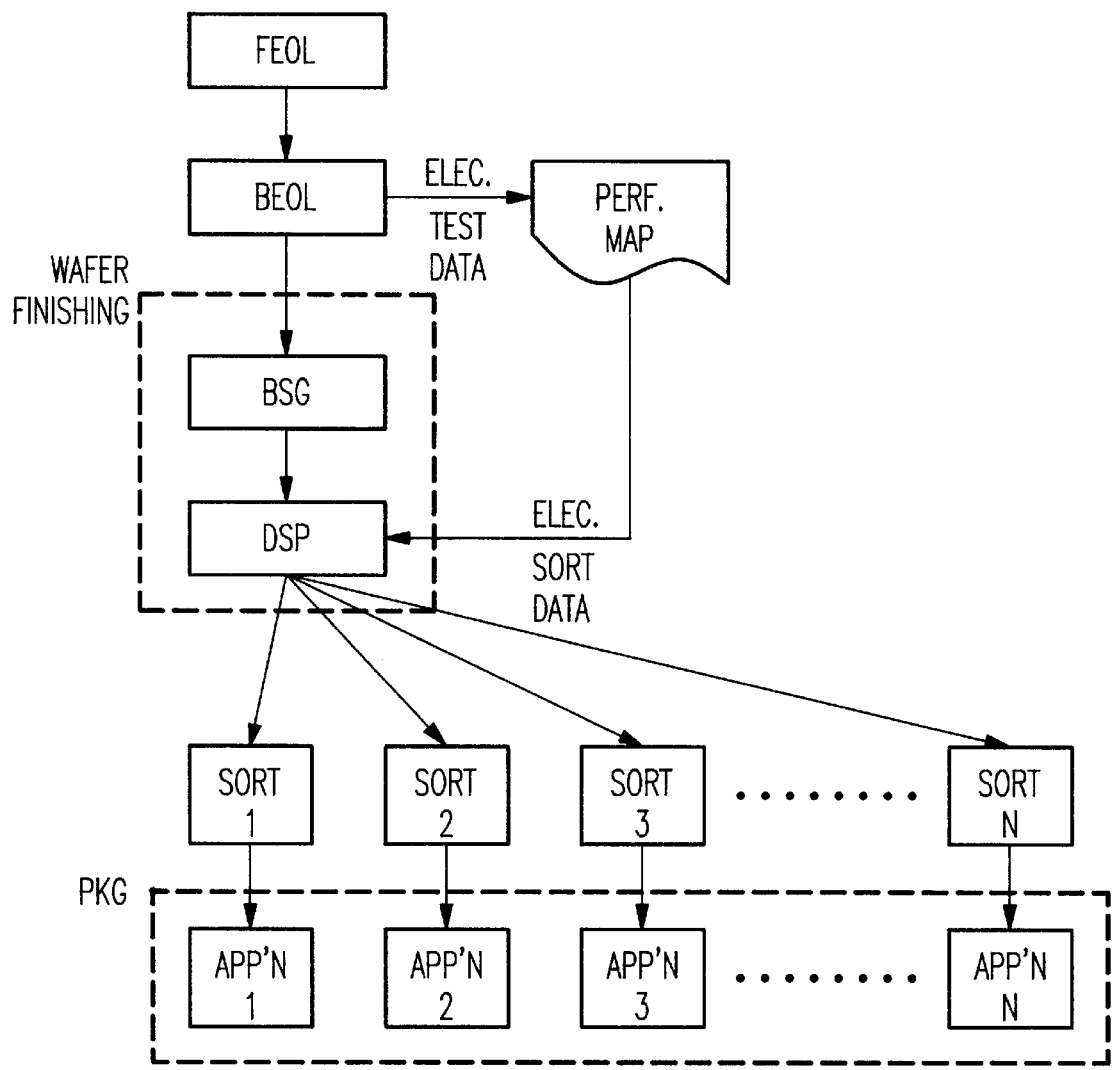
FIG. 1 shows a flow chart for semiconductor device fabrication (Prior Art).
Figure 4B:
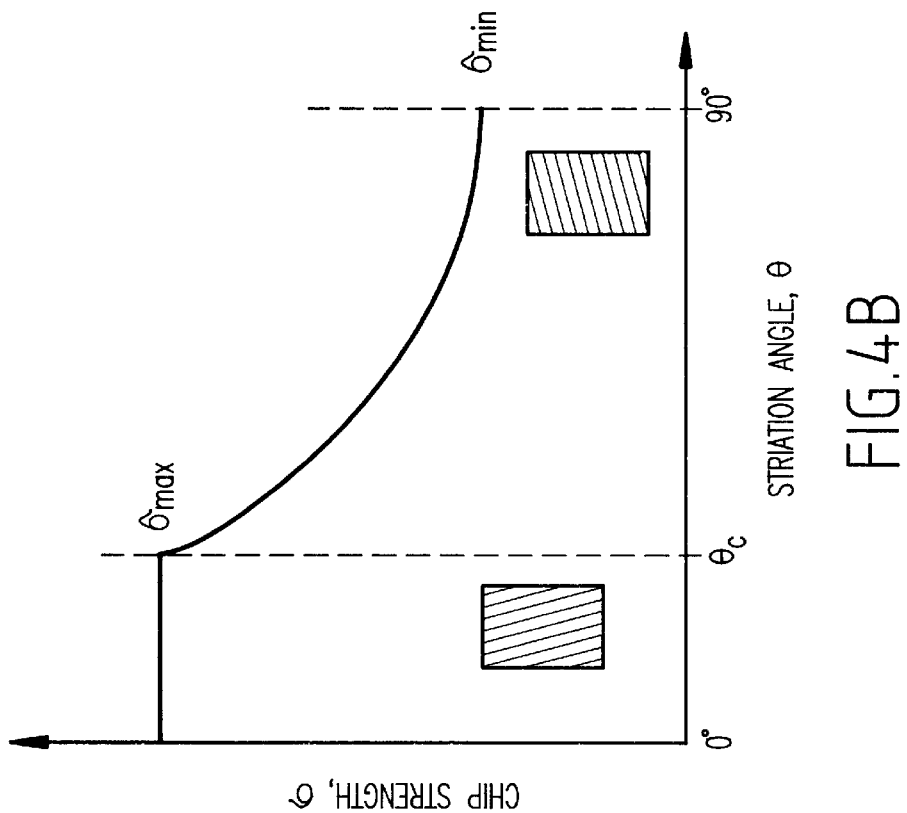
FIG. 4B shows a plot of the relationship between the strength σ (the maximum sustainable applied tensile stress) of the chip and the striation orientation angle θ.
Figure 4A:
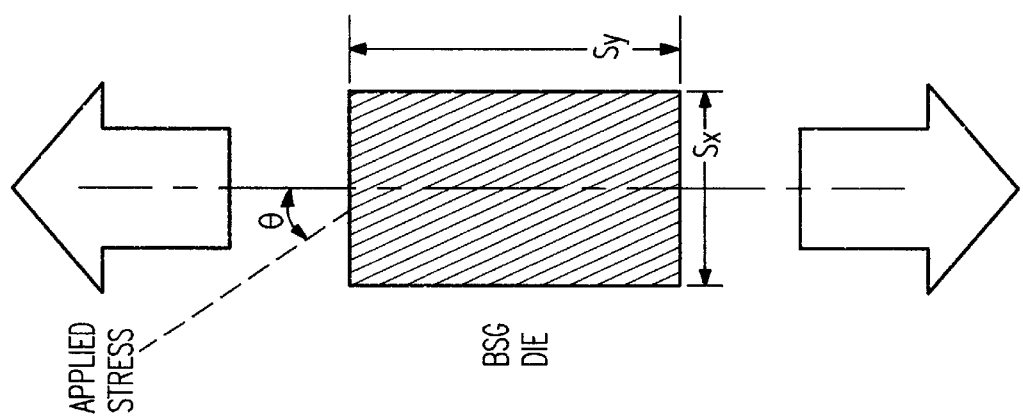
FIG. 4A shows a schematic diagram of the backface of a ground rectangular chip. The indicated grinding striations are oriented at an angle θ to the long axis of the chip, which is assumed to be parallel to the tensile stress applied to the chip, indicated by the arrows.

A key element of the invention is the discovered relation, shown in FIG. 4, between the strength of a device and the orientation of the back-face striations remnant from the grinding process. Such striations are caused by the motion of the grinding wheel particles over the semiconductor surface, as shown in FIG. 2. Such striations are usually of the order of 1–5 μm wide and 0.5–2 μm deep. Beneath the striations are cracks of comparable size or the nuclei of cracks that can be initiated by applied tension. In general, devices containing striations running more parallel to the long axis of the chip (and the packaging stress) are stronger than devices containing striations running more perpendicular to the long axis of the chip. An experimental relationship, shown in FIG. 4b, found by the inventors that describes many observations is $$\sigma = \sigma_{max} \qquad \theta \leq \theta_c \qquad [1]$$
$$\sigma = \sigma_{min}/\sin\theta \qquad \theta > \theta_c$$

where σ is the strength observed for striations of a given angle θ to the long axis of the device, $\sigma_{max}$ is a maximum strength, $\sigma_{min}$ is a minimum strength and $\theta_c = \sin^{-1}(\sigma_{min}/\sigma_{max})$ is a critical angle below which the strength does not increase with decreasing angle. Note that this relationship is only one of many that could be used, but it does retain the idea of a projected stress over the striation. Note also that the strength is pinned at $\sigma_{max}$ for $\theta \leq \theta_c$ and hence changes in the striation orientation have no effect once the striations are "parallel enough" to the long axis of the device. In many cases the ratio $\sigma_{min}/\sigma_{max}$ is approximately 1/3 to 1/2, giving $\theta_c$ values in the range 20° to 30°. Typical tensile strength values for semiconductor chips are $\sigma_{min} \cong 150$ MPa (Mega Pascals) and $\sigma_{max} \cong 450$ MPa. These values for any particular set of chips can be determined by tensile or flexural strength testing.

The foregoing tensile strength values can be increased, so as to allow all chips on a backside-ground wafer to exceed a given strength level, by polishing the backside of the wafer so as to remove the striations. This can be done as part of the wafer finishing process, without removing the wafer from the grinding tape. The polishing involves abrading the backside of the wafer with pressurized abrasive particles (such as the silicon debris from the BSG process) to substantially eliminate striations. This abrading step can be accomplished with an aqueous spray.

An inspection method can be designed to sort chips for mechanical performance using the above relationship and direct inspection of the backface striations of individual chips. A vacuum pencil or other fixture can lift each chip so that the striations and chip edge can be viewed by an operator or an automated vision system and a determination made of the striation angle θ. Simple binary acceptance or rejection of the chip can then be made on the basis of θ, via the pre-determined strength relation and knowledge of a single package stress. Alternatively, ranges of θ can be used to sort chips into multiple categories via the strength relation and knowledge of many package stresses.

There are two further ways the strength relation aspect of the invention can be used to improve mechanical yield that do not involve direct inspection of individual devices:

1. A grinding method can be designed that produces striations of appropriate orientation on the diced devices, such that all devices on a ground wafer meet a minimum specified strength level. Belt or creep-feed grinding (FIGS. 2A and 2B, respectively) offer this possibility. The minimum strength is set by the most severe PKG stress or by the largest acceptable yield loss.
2. A sorting method can be designed that uses an existing grinding method, wafer geometry, chip geometry and chip location on the wafer to determine the striation orientation and hence strength for a given chip. Belt, creep-feed or in-feed grinding methods (FIGS. 2A, 2B and 2C, respectively) offer simple and common possibilities. The diced chips are sorted by either the binary or multiple methods described above, but without individual inspection.

EXAMPLE 1

Belt Grinding

Figure 5A:
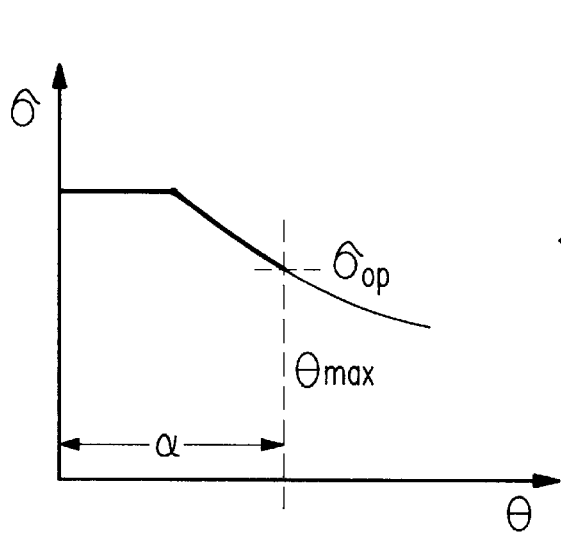
FIG. 5A shows a plot of the allowed range of striation angles, $0 \leq \theta \leq \theta_{max}$ that backface ground devices must have in order to meet a minimum operating strength, $\sigma_{op}$.
Figure 5B:
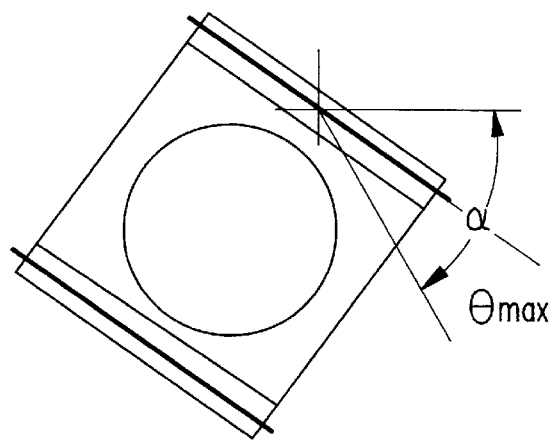
FIG. 5B shows a schematic diagram of the controlled range of orientations α that a belt grinder must have in order to produce the allowed range of operating strengths.
Figure 5D:
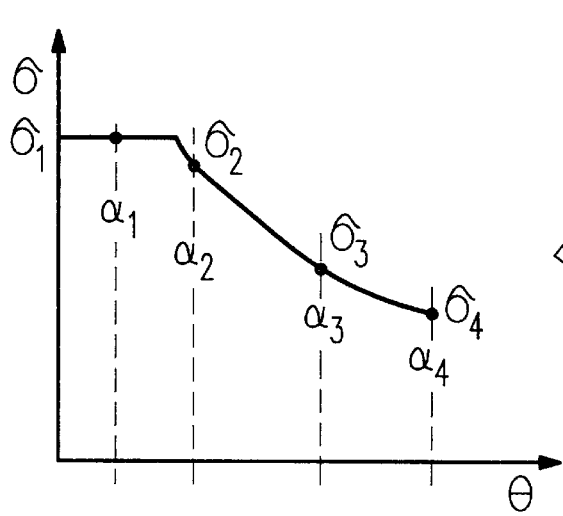
FIG. 5D shows a plot of the sorted strengths $\sigma_1$, $\sigma_2$, $\sigma_3$, $\sigma_4$ produced by the uncontrolled orientations.
Figure 5C:
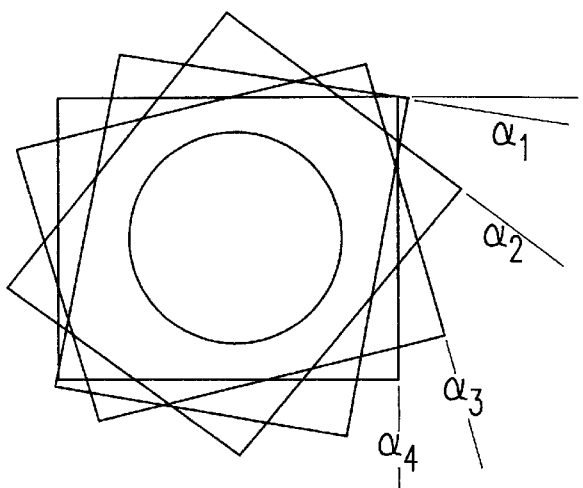
FIG. 5C shows schematic diagrams of belt grinders having uncontrolled orientations $\alpha_1$, $\alpha_2$, $\alpha_3$, $\alpha_4$.

A required operating strength of a device, $\sigma_{op}$, imposes a maximum allowed striation angle, $\theta_{max}$ that the grinding process can produce, as shown in the plot in FIG. 5A. A belt (or rotating abrasive roller) grinding method can be designed such that the relative orientation of the belt motion and the long axes of chips, α, is controlled to be less than $\theta_{max}$, as shown in the schematic in FIG. 5B, and therefore all devices will be stronger than $\sigma_{op}$. Alternatively, a belt sorting method can be designed such that if the relative orientation α is not controlled, but known for a given wafer, as shown in the schematic in FIG. 5C, all devices on a wafer will have the same strength and can be sorted appropriately in accordance with the plot shown in FIG. 5D. Those skilled in the art will readily understand that this orientation of grinding motion relative to the long axes of chips can be controlled or known to within $\theta_{max}$ by using a variety of mechanical devices which have a grinding result similar to a belt, such as a rotating abrasive roller. For the purposes of this disclosure and subsequent claims, the terms "belt grinding" or "belt or roller" are to be understood to include this broader class of equivalent grinding devices.

A second element of the invention is the recognition that the average orientation of striations on the back face of a rotary-ground device is determined by the method of grinding, the dimensions of the wafer, the dimensions of the device and the location of the device on the wafer. In the case of creep-feed grinding, the radius of the grinding wheel is greater than the radius of the wafer and the striation pattern consists of a series of arcs with translational symmetry along the translation line and mirror symmetry perpendicular to it, as shown in FIG. 2b. In the case of in-feed grinding, the diameter of the grinding wheel is greater than the radius of the wafer and the striation pattern consists of a series of arcs with rotational symmetry about the wafer center, as shown in FIG. 2c. In both cases, the striation pattern is the result of the trailing edge of the grinding wheel passing over the wafer surface.

Figure 6:
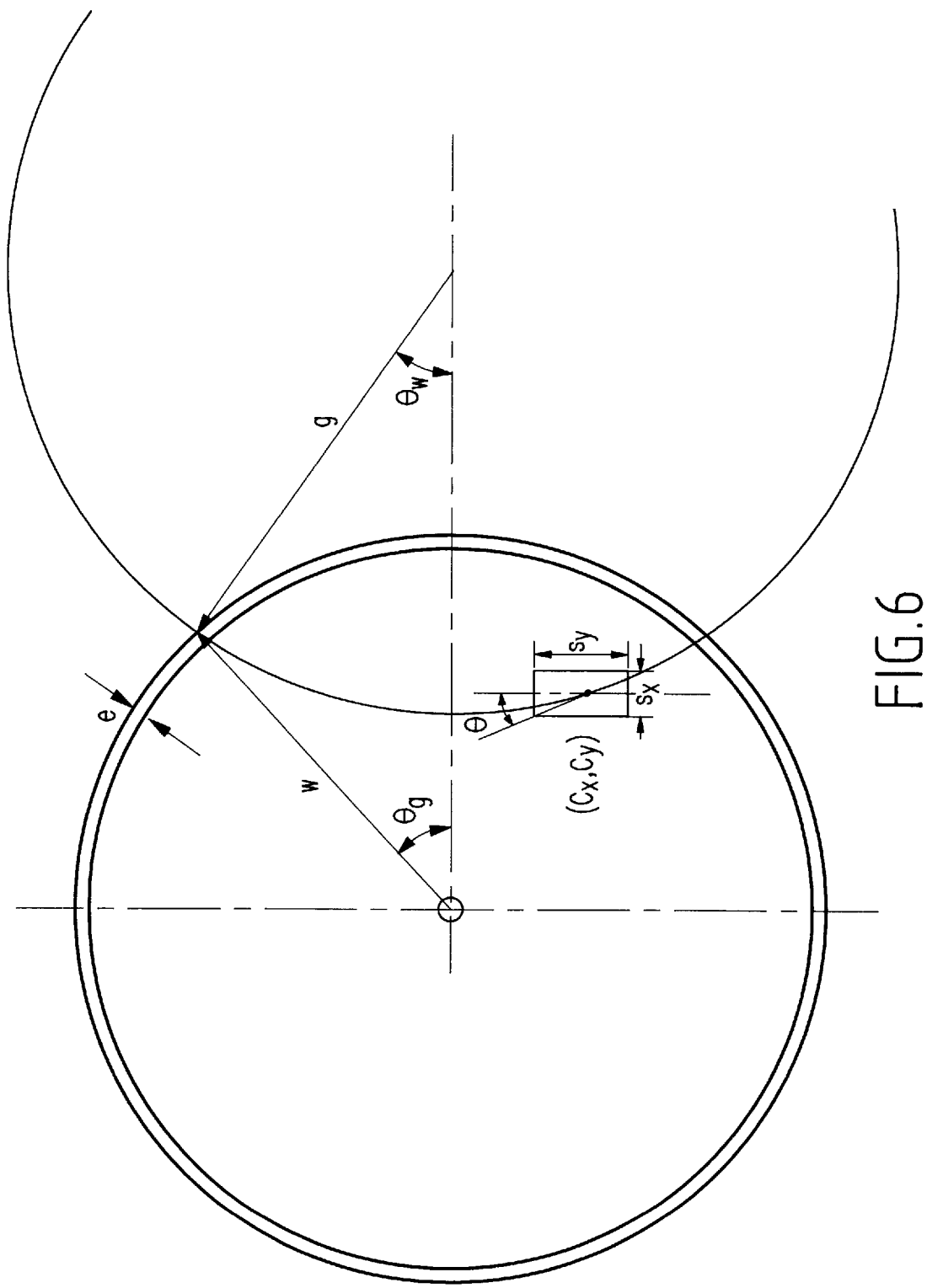
FIG. 6 shows a schematic diagram of a grinding wheel passing over a wafer in the creep-feed grinding method, such that a grinding striation passes through a chip center at an angle to the long axis of the chip. The dimensions and relevant angles for designing grinding and sorting methods for chip strength are shown.
Figure 7:
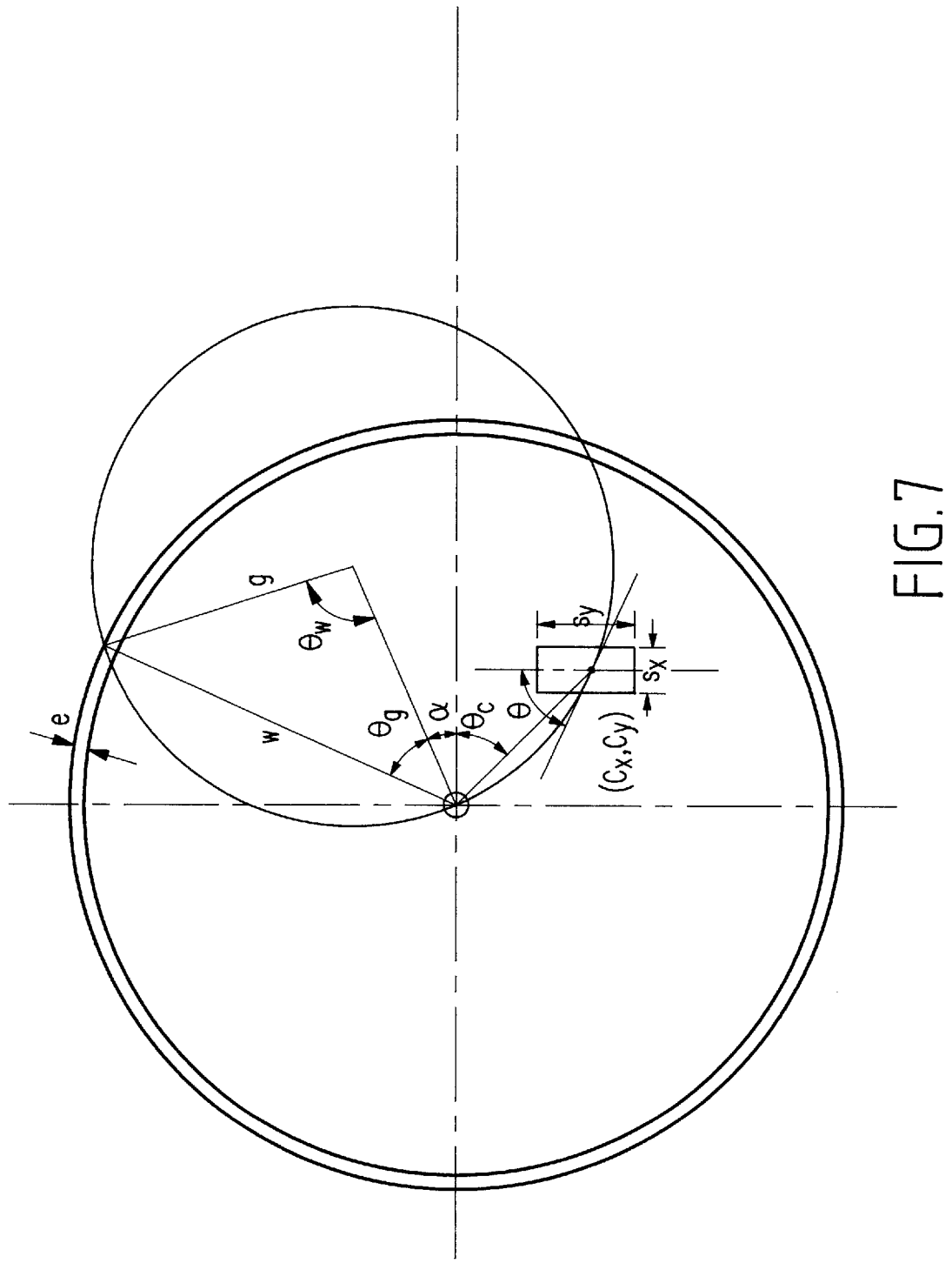
FIG. 7 shows a schematic diagram of a grinding wheel passing over a wafer in the in-feed grinding method, such that a grinding striation passes through a chip center at an angle to the long axis of the chip. The dimensions and relevant angles for designing grinding and sorting methods for chip strength are shown.

Creep-feed and in-feed grinding are distinguished from belt grinding in that not all chips on a wafer have striations of the same orientation, and hence a range of chip strengths is produced from a single wafer. The dimensions of the wafer and device enter into the calculation of the striation orientation at a given device location and hence the design of grinding and sorting methods. The following notation will be used, with reference to FIGS. 6 and 7: w=wafer radius; e=wafer edge-exclusion distance; g=grinding wheel radius; $(g_x, g_y)$=co-ordinates of the grinding wheel center relative to the wafer center; $(c_x, c_y)$=co-ordinates of a chip center relative to the wafer center; and $(s_x, s_y)$=dimensions of the chip in x and y directions. The long axes of the chips will be assumed to lie parallel the y-axis, such that $s_x < s_y$.

The general equation of a grinding arc leading to a striation is thus $$(x-g_x)^2+(y-g_y)^2=g^2 \quad [2]$$

and the constraint on the center co-ordinates of a chip is $$(|c_x|+s_x/2)^2+(|c_y|+s_y/2)^2 \leq (w-e)^2 \quad [3]$$

where |q| indicates the absolute value of a quantity q. The general equation for the slope relative to the x-axis, m, of an arc that passes through the center of a chip is $$m = -\frac{(c_x - g_x)}{(c_y - g_y)} \quad [4]$$

and hence the average striation angle θ for a device is $$\theta = |\tan^{-1}(1/m)| \quad [5]$$

The coordinates of the grinding wheel center can be expressed as $$g_x = g \cos \alpha \quad g_y = g \sin \alpha \quad [6]$$

such that $$g_y = (\tan \alpha) g_x \quad [7]$$

where α is the angle subtended at the wafer center by the x axis and the grinding wheel center. The angle subtended at the wafer center by the intersection of the wafer edges with the grinding wheel is $2\theta_g$, and the converse angle subtended at the grinding wheel center by the intersection of the grinding wheel edges with the wafer is $2\theta_w$. These two angles are related by $$\frac{\sin\theta_w}{w} = \frac{\sin\theta_g}{g} \quad [8]$$

EXAMPLE 2

Creep-Feed Grinding

Figure 8B:
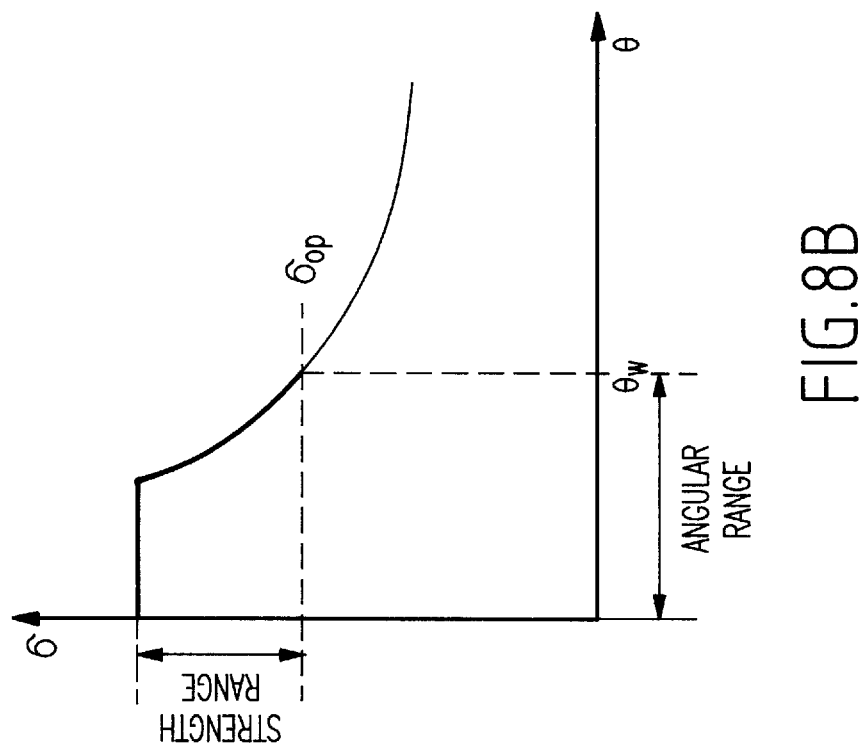
FIG. 8B shows a plot of the range of angles and strengths produced for wafer ground using the creep-feed method.
Figure 8A:
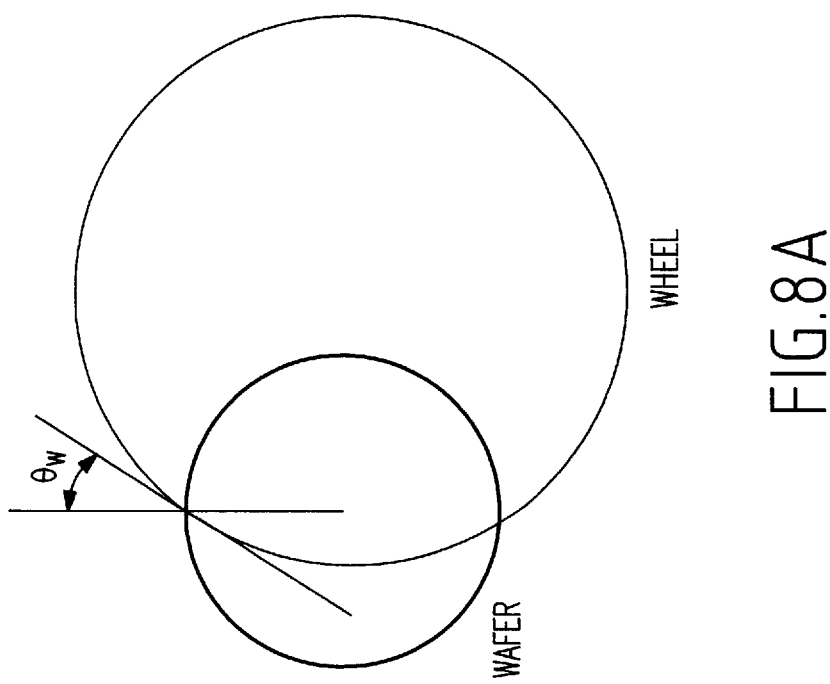
FIG. 8A shows a schematic diagram of the grinding arc on wafer ground using creep feed such that the largest striation angle occurs.

It is possible to design a creep-feed grinding method that allows all chips on a wafer to meet a strength requirement of $\sigma_{op}$, as shown in FIG. 8B, by producing a maximum allowed striation angle $\theta_{max}$ for any chip on a wafer, FIG. 8A.

For edge-feed grinding, α is a fixed value, constraining $(g_x, g_y)$ to linear travel of the wheel over the center of the wafer, in accordance with Equation [7]. A useful case is $\alpha=0°$, such that the grinding wheel travels along the x axis and $g_y=0$. Hence the grinding wheel center x co-ordinate is given (from Equation [2]) by $$g_x = (g^2 - c_y^2)^{1/2} + c_x \qquad [9]$$

and the striation angle becomes independent of the x co-ordinate (from Equations [4] and [5]):

$$\theta = \tan^{-1} \left| \frac{c_y}{(g^2 - c_y^2)^{1/2}} \right| \qquad [10]$$

It can be seen that $\theta$ decreases for chips closer to the line of travel of the grinding wheel, smaller $c_y$, and for larger grinding wheel radii, g.

The maximum striation angle along an arc occurs at the edge of the wafer and is equal to the instantaneous value of $\theta_w$ for a given $g_x$ value:

$$\theta_w = \tan^{-1} \left| \frac{y_{int}}{g_x - x_{int}} \right| \qquad [11a]$$

where the intersection coordinates are $$x_{int} = (w^2 - g^2 + g_x^2)/2g_x \quad y_{int} = (w^2 - x_{int}^2)^{1/2} [11b]$$

The maximum striation angle on a wafer occurs for chips at the extreme points on the wafer edge, $c_y \cong y_{int} = w$ such that $\theta_{max} = \tan^{-1}[w/(g^2 - w^2)^{1/2}]$ from Equations [10] or [11]. The minimum striation angle $\theta_{min}=0$ occurs for chips along the center-line of the wafer, $c_y=0$.

Figure 9A:
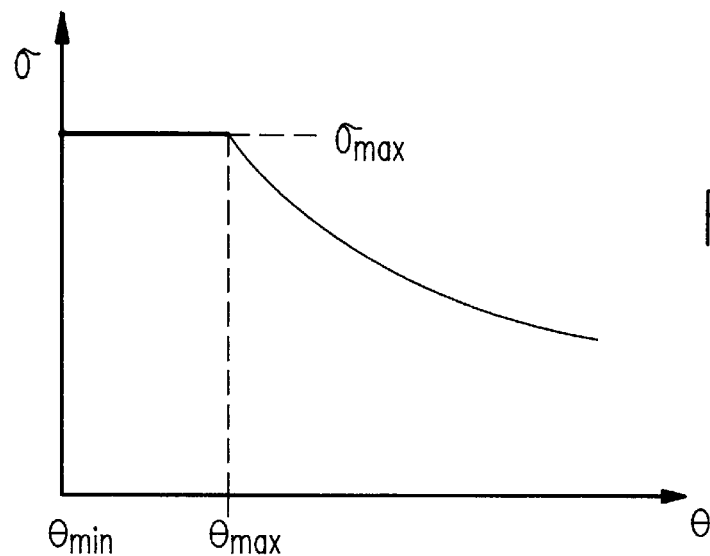
FIG. 9 shows the striation angle and strength ranges produced for optimal orientation (FIG. 9A), complete misorientation (FIG. 9B), and intermediate orientation (FIG. 9C) of wafers ground using creep-feed grinding.
Figure 9B:
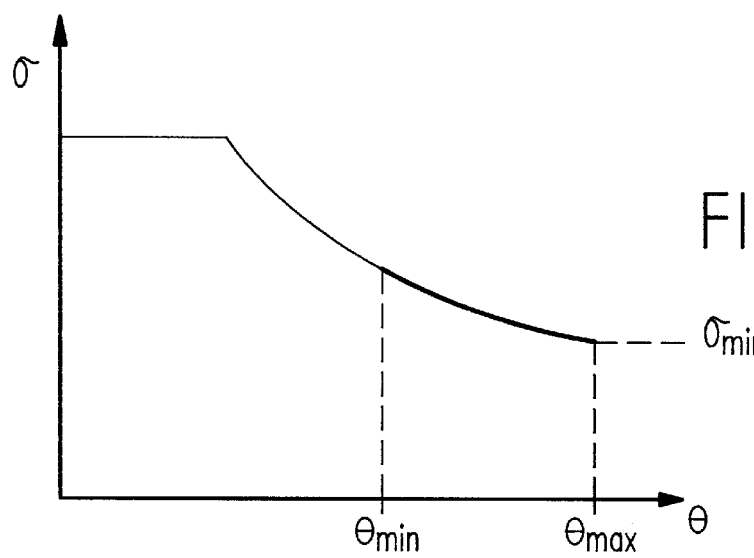
Figure 9C:
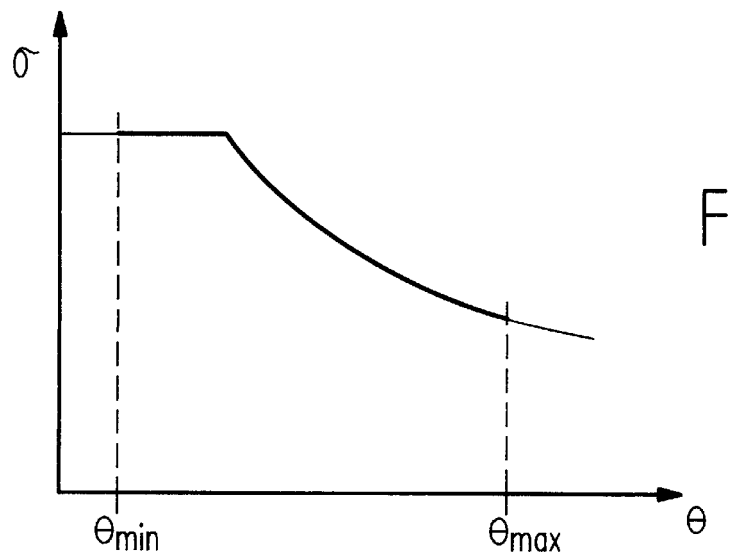
Figure 10:
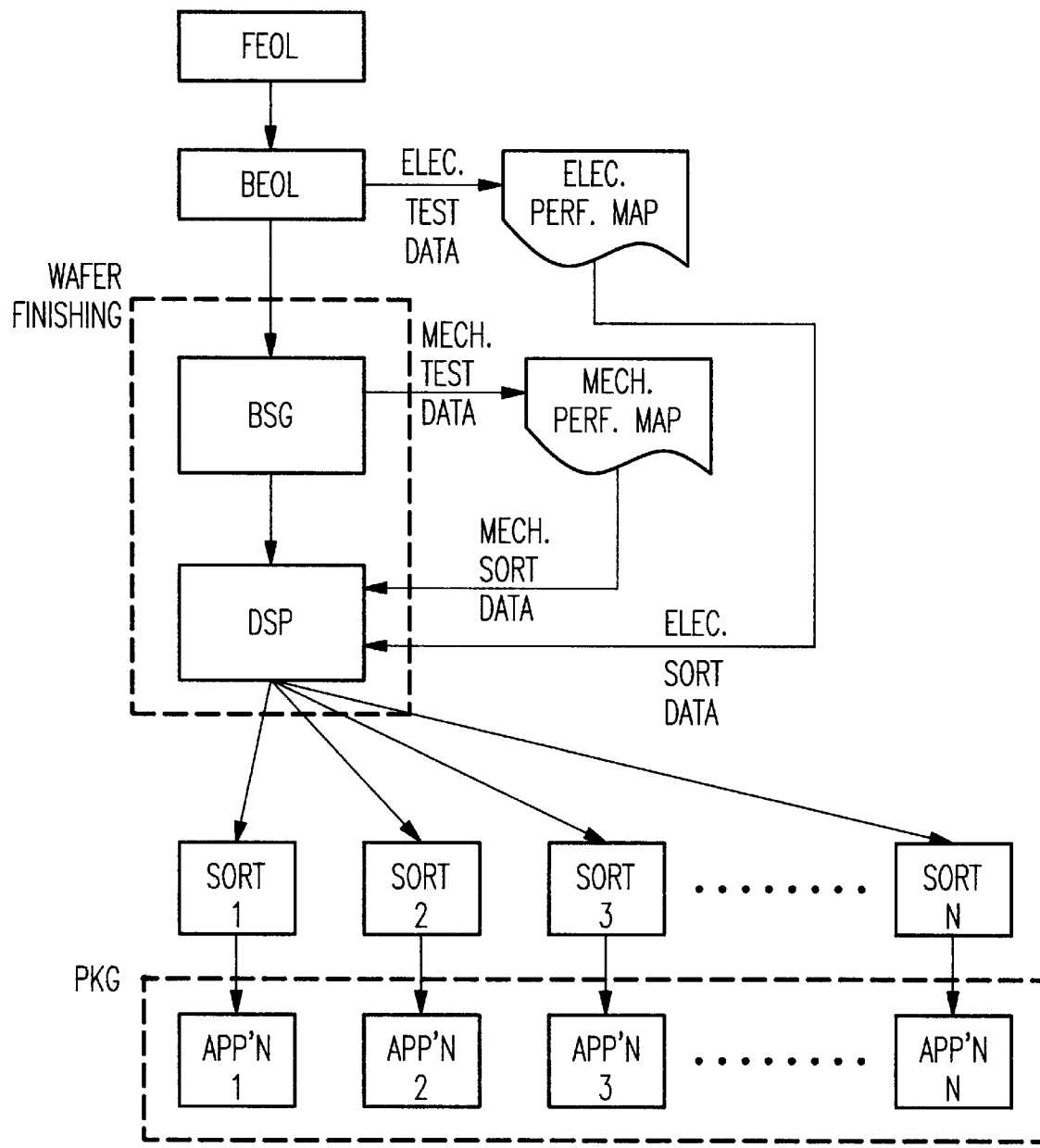
FIG. 10 shows a flow chart for semiconductor device fabrication in which mechanical sorting of chips is overlayed on electrical sorting.

A useful approximation now emerges to ensure that all devices on a wafer have striation orientations less than $\theta_c$ and therefore the invariant strength maximum strength $\sigma_{max}$. Assuming that $\theta_c \cong 25°$, the maximum value of $c_y=w$ gives the minimum required grinding wheel radius relative to the wafer diameter from Equation [10] as $$g_{min} \leq \sqrt{3} \ w \qquad [12]$$

such that $\theta_{min}=0°$ and $\theta_{max}=\theta_c=25°$. The resulting angular distribution and invariant maximum strength is shown in FIG. 9A. For the same grinding wheel radius, a worst-case rotation of the wafer, such that $\alpha=90°$, yields an angular distribution from $\theta_{min}=54°$ to $\theta_{max}=90°$, and a strength distribution extending from $\sigma_{min}$ to approximately 22% greater than $\sigma_{min}$, shown in FIG. 9B. An intermediate rotation of $\alpha=45°$ yields an angular distribution from $\theta_{min}=10°$ to $\theta_{max}=76°$, and a strength distribution extending from 3% greater than $\sigma_{min}$ to $\sigma_{max}$, shown in FIG. 9C.

Designing a creep-feed grinding method such that all chips exceed a less stringent strength level $\sigma_{op}$ is then a matter of selecting a minimum grinding wheel radius as shown by Equation [10], from a knowledge of the maximum allowed striation angle, taking into account the risks inherent in misorientation as illustrated above. Designing a creep-feed sorting method requires a knowledge of the chip location on the wafer as given in Equation [10] for optimally oriented wafers, or by the combination of Equations [4] and [7] for misoriented wafers.

EXAMPLE 3

In-Feed Grinding

In-feed grinding is distinguished from creep-feed grinding in that a minimum strength requirement $\sigma_{op}$ cannot be met for all chips on a wafer as the full angular range, $\theta_{min}=0°$ to $\theta_{max}=90°$, is produced over the wafer. Hence, a grinding method cannot be designed for in-feed grinding and the strength relation can only be used in a sorting method.

For in-feed grinding $\alpha$ varies in time as the grinding wheel center describes a circle about the wafer center, as shown in Equation [6]. The problem of calculating $\theta$ for a chip at given coordinates $(c_x, c_y)$ can be recast as a search algorithm for $\alpha$ as follows, with reference to FIG. 9. The angle between the x axis and the chip center $\theta_c$ is given by $$\theta_c = \tan^{-1}(c_x/c_y) \qquad [13]$$

and the fixed angle $\theta_g$ is given by $$\cos \theta_g = w/2g \qquad [14]$$

such that $$\theta_c + \theta_g < \alpha < \theta_c + 90° \qquad [15]$$

Hence, given the chip location, the value of $\alpha$ can be searched for in small units of angle in the range indicated until the generalized arc equation, Equation [2]:

$$[c_x - (g^2 - g^2 \sin^2 \alpha)^{1/2}]^2 + [c_y - g \sin \alpha]^2 = g^2 \qquad [16]$$

is met, yielding $\alpha$ and thence allowing $\theta$ to be calculated from Eqs. 4–6. Chips can thus be sorted accordingly by the strength relation without recourse to direct inspection. The geometrical considerations leading to the bounds on $\alpha$ in Equation [15] lead to a time-efficient sequence for calculating (i) the exact $\alpha$ value from Equation [16], (ii) the $\theta$ value from Equations [4–6], and (iii) the strength value $\sigma$ from Equation [1]. A direct, unbounded search solution of Equation [16] is extremely inefficient—rendering the resulting sorting-without-direct-inspection-method extremely time consuming.

While the invention has been described in terms of preferred embodiments for various grinding methods, those skilled in the art will recognize that the invention can be practiced with modification within the spirit and scope of the appended claims.

Having thus described our invention, what we claim as new and desire to secure by Letters Patent is as follows:

1. A method for reducing chip breakage during semiconductor manufacture, comprising the steps of:

determining the orientation of striations on the back side of chips on a backside ground wafer;

using said striation orientation to determine the tensile strength of said chips; and matching said chips by tensile strength with tensile strength requirements of a chip packaging process.

2. The method of claim 1, wherein said matching step further comprises the steps of:

overlaying a map of said chip tensile strength upon a map of chip electrical performance; and using said overlay to sort said chips for a plurality of applications and a plurality of packaging schemes in accordance with said chip packaging process.

3. The method of claim 2, wherein said chip sorting serves to optimize the yield of said chips in said chip packaging process.

4. The method of claim 3, wherein said yield optimization is achieved by the further steps of:

assigning chips to said applications in accordance with said map of chip electrical performance; and assigning chips to said packaging schemes in accordance with said map of chip tensile strength.

5. The method of claim 4, wherein said chip tensile strength assigning is accomplished by using high tensile strength chips in high stress packaging schemes and by using low tensile strength chips in low stress packaging schemes.

6. The method of claim 1, wherein said matching step further comprises the step of:

selecting a grinding method and a grinding geometry, such that the resulting striations have an orientation on said chips meeting a minimum strength level specified for said packaging process.

7. The method of claim 6, wherein said minimum specified strength level is set by the most severe stress of said packaging process.

8. The method of claim 6, wherein said minimum specified strength level is set by the largest acceptable yield loss for said packaging process.

9. A method for reducing chip breakage during semiconductor manufacture, comprising the steps of:

determining the orientation of striations on the back side of said chips, said wafer having been ground with a grinding wheel, belt or roller, wherein said striation orientation is determined by either direct inspection or mathematical inference;

using said striation orientation to ascertain the tensile strength of said chips, and generating a map thereof corresponding to the location of said chips on said wafer;

determining tensile strength requirements of a plurality of packaging schemes;

using said map in a die picking and sorting process wherein said chip tensile strength meets said tensile strength requirements of said packaging schemes.

10. A method for reducing chip breakage during semiconductor manufacture, comprising the steps of:

testing the electrical performance of chips on a wafer, and generating a first map thereof corresponding to the location of said chips on said wafer;

determining the orientation of striations on the back side of said chips, said wafer having been ground with a grinding wheel, belt or roller, wherein said striation orientation is determined by either direct inspection or mathematical inference;

using said striation orientation to ascertain the tensile strength of said chips, and generating a second map thereof corresponding to the location of said chips on said wafer;

overlaying said second map on said first map;

determining electrical performance requirements of a plurality of applications;

determining tensile strength requirements of a plurality of packaging schemes;

using said first and second maps in a die picking and sorting process wherein said chip electrical performance meets said electrical performance requirements of said applications and wherein said chip tensile strength meets said tensile strength requirements of said packaging schemes.

11. The method of claims 1, wherein said using step employs the relationship $$\sigma = \sigma_{max} \quad \theta \leq \theta_c$$
$$\sigma = \sigma_{min}/\sin\theta \quad \theta > \theta_c$$

where $\sigma$ is the strength observed for striations of a given angle $\theta$ to the long axis of said chip, $\sigma_{max}$ is a maximum strength, $\sigma_{min}$ is a minimum strength and $\theta_c = \sin^{-1}(\sigma_{min}/\sigma_{max})$ is a critical angle below which the strength does not increase with decreasing angle.

12. The method of claim 9, wherein said using step employs the relationship $$\sigma = \sigma_{max} \quad \theta \leq \theta_c$$
$$\sigma = \sigma_{min}/\sin\theta \quad \theta > \theta_c$$

where $\sigma$ is the strength observed for striations of a given angle $\theta$ to the long axis of said chip, $\sigma_{max}$ is a maximum strength, $\sigma_{min}$ is a minimum strength and $\theta_c = \sin^{-1}(\sigma_{min}/\sigma_{max})$ is a critical angle below which the strength does not increase with decreasing angle.

13. The method of claim 10, wherein said using step employs the relationship $$\sigma = \sigma_{max} \quad \theta \leq \theta_c$$
$$\sigma = \sigma_{min}/\sin\theta \quad \theta > \theta_c$$

where $\sigma$ is the strength observed for striations of a given angle $\theta$ to the long axis of said chip, $\sigma_{max}$ is a maximum strength, $\sigma_{min}$ is a minimum strength and $\theta_c = \sin^{-1}(\sigma_{min}/\sigma_{max})$ is a critical angle below which the strength does not increase with decreasing angle.

14. The method of claim 1, wherein said mathematical inference is drawn from the geometries of said chip, wafer, and grinding wheel, belt or roller.

15. The method of claim 9, wherein said mathematical inference is drawn from the geometries of said chip, wafer, and grinding wheel, belt or roller.

16. The method of claim 10, wherein said mathematical inference is drawn from the geometries of said chip, wafer, and grinding wheel, belt or roller.

17. A method of fabricating a semiconductor package, comprising the steps of:

a) providing semiconductor chips, said chips being from wafers that have been thinned in a grinding step, said chips having back side striations from said grinding step, said chips having a shortest edge and a longest edge;

b) sorting said chips according to striation orientation; and c) packaging said chips into packages to provide chips with striations approximately parallel to the shortest edge in lower stress packages and chips with striations approximately parallel to the longest edge in higher stress packages.

* * * * *